United States Patent [19]

Ohsawa et al.

[11] Patent Number: 4,528,064

[45] Date of Patent: Jul. 9, 1985

[54] METHOD OF MAKING MULTILAYER CIRCUIT BOARD

[75] Inventors: Kenji Ohsawa, Yokohama; Takao Ito, Ohta; Masayuki Ohsawa; Keiji Kurata, both of Atsugi, all of Japan

[73] Assignee: Sony Corporation, Tokyo, Japan

[21] Appl. No.: 670,912

[22] PCT Filed: Dec. 8, 1981

[86] PCT No.: PCT/JP81/00371

§ 371 Date: Aug. 5, 1982

§ 102(e) Date: Aug. 5, 1982

[87] PCT Pub. No.: WO82/02138

PCT Pub. Date: Jun. 24, 1982

Related U.S. Application Data

[62] Division of Ser. No. 406,231, Aug. 5, 1982, abandoned.

[30] Foreign Application Priority Data

Dec. 8, 1980 [JP] Japan ................. 55-175739[U]

[51] Int. Cl.³ .................. C23F 1/02; B44C 1/22; C03C 15/00; C03C 25/06
[52] U.S. Cl. ...................... 156/630; 29/852; 156/634; 156/644; 156/902; 174/68.5; 427/97
[58] Field of Search ............ 156/629, 630, 633, 634, 156/644, 901, 902; 174/68.5; 29/846, 648, 850, 852; 427/88-90, 96, 97; 430/313, 317, 318

[56] References Cited

U.S. PATENT DOCUMENTS

| | | | |
|---|---|---|---|
| 2,447,541 | 8/1948 | Sabee et al. ................. | 174/68.5 |
| 3,311,966 | 4/1967 | Shaheen et al. ............. | 156/630 X |
| 3,374,129 | 3/1968 | Boucher ..................... | 156/630 |
| 3,846,166 | 11/1974 | Saiki et al. ................. | 174/68.5 X |
| 4,030,190 | 6/1977 | Varker ........................ | 29/852 |
| 4,336,100 | 6/1982 | Passlick ..................... | 174/68.5 X |
| 4,383,363 | 5/1983 | Hayakawa et al. ......... | 174/68.5 X |
| 4,388,136 | 6/1983 | Huie et al. .................. | 174/68.5 X |
| 4,420,364 | 12/1983 | Nukii et al. ................. | 156/901 X |

Primary Examiner—William A. Powell
Attorney, Agent, or Firm—Hill, Van Santen, Steadman & Simpson

[57] ABSTRACT

A multilayer circuit board provided with multilayer wiring patterns as upper and lower multilayers is provided, in which on a first circuit board 24 with a first wiring pattern 23 formed thereon a copper foil 27 is bonded through an insulating resin layer 25, the patterning is carried out so as to form a second wiring pattern 33, and the upper and lower patterns 23 and 33 are connected to each other by conductive substance 34 filled within an opening portion 32 of the second wiring pattern 33. In accordance with this multilayer circuit board, the quality thereof is improved, the manufacturing thereof is carried out at low cost, and in addition, it becomes possible to form a circuit of high density integration.

8 Claims, 29 Drawing Figures

METHOD OF MAKING MULTILAYER CIRCUIT BOARD

This is a division of application Ser. No. 406,231, filed Aug. 5, 1982, abandoned.

TECHNICAL FIELD

The present invention relates to a multilayer circuit board.

BACKGROUND ART

As a conventional multilayer circuit board it is known that, for example, as shown in FIGS. 1A and 1B, a so-called rigid circuit board 3 which is made by forming a first circuit pattern 2 made of copper foil on a thick insulating substrate 1 made of such as paper impregnated with phenolic resin or paper impregnated with epoxy resin and the like is laminated on and made integral with a so-called flexible circuit board 6 which is made by forming a second circuit pattern 5 made of copper foil on a film 4 made of such as polyimide resin, polyester resin and the like by way of an adhesive insulating layer (for example, epoxy resin adhesive) 7, in which the upper and lower wiring patterns 5 and 2 are connected together by conductive material 8 to form a multilayer circuit board 9. Reference numeral 10 denotes an electric device mounted on the substrate 9, and numeral 11 denotes a solder.

In the multilayer circuit board 9 thus composed, there are such disadvantages that since a distance between the upper and lower patterns 2 and 5 is so large, the connection between both the patterns 2 and 5 through the conductive material 8 is low in reliability; at a connection portion 12 of the electric component 10, both the patterns 2 and 5 can not be directly soldered together by the same solder 11 at the same time for mounting the component thereon; and a fairly small aperture with a diameter less than $1_{mm}$ is difficult to be bored through the flexible circuit board 6, which results in that a high quality one or one with high density integration can not be produced. Moreover, in the case of the manufacturing, as shown in FIG. 2, when the wiring pattern 5 of the upper layer is formed by a selective etching method to remove copper foil of uncovered portions on a resist ink 13 formed by printing, the wiring pattern 2 of the lower layer facing a through-hole 14 is eroded or etched (shown by reference numeral 15 in the figure) by etchant. Therefore, it is necessary to cover or fill the through-hole 14 beforehand with resist ink, so the manufacturing process is quite complicated.

DISCLOSURE OF INVENTION

In accordance with the present invention, a conductive foil is bonded on a first circuit board with a predetermined first wiring pattern formed thereon by way of an insulating resin layer formed other than at least upper and lower connection portions, they are integrally laminated with one other by heat roll, heat press or the like, and an opening portion on the second wiring pattern made of this conductive foil which reaches the afore-described first wiring pattern (connection portion) is filled with conductive substance so as to connect the upper and lower first and second wiring patterns. In the present invention as mentioned above, a distance (step-like distance) between the afore-mentioned first and second wiring patterns at the connection portion is extremely reduced (about 5μ to 20μ), and in addition, in the opening portion as described above the edge portion of the second wiring pattern is introduced into the inside thereof, so that the conductivity between the first and second wiring patterns is improved by the afore-described conductive substance, and hence a so-called through-hole connection with high reliability can be achieved. Moreover, since the distance between the first and second wiring patterns is small or short, in the case of patterning the afore-described copper foil, the resist ink can be printed within the afore-described opening portion so that the selective etching process is made easier. Further, when the electric component is mounted by dipping in a solder bath, the afore-described first and second wiring patterns can be connected by the same solder dipping process at the connection portion of the lead wire of the electric component. Also, the opening portion of the second wiring pattern as described above can be bored by a chemical etching technique so that an opening portion of a fairly small diameter (diameter of about 0.4 mm) can be formed and hence a fairly fine circuit pattern can be formed. Moreover, when the gallium alloy is employed as the afore-mentioned conductive substance, there are brought about such advantages that an electromigration as in silver paint will never occur and adjacent circuits will never be short-circuited thus the present invention being suitable for a high density circuit, the conductivity is satisfactory and the high frequency characteristic is good, the volume of the paste thus filled will never be contracted in volume and therefore the connection reliability is increased, and so forth. In addition, the insulation between the first and second circuits can be set to have a sufficient thickness by the insulating resin and the adhesive agent, and is superior in electric insulation. As stated above, the present invention can provide a multilayer circuit board inexpensively which is of a high quality and a high density circuit.

BEST MODE FOR CARRYING OUT THE INVENTION

Hereinafter, with reference to the drawings, embodiments of a multilayer circuit board according to the present invention will be described in detail.

Figure 3:
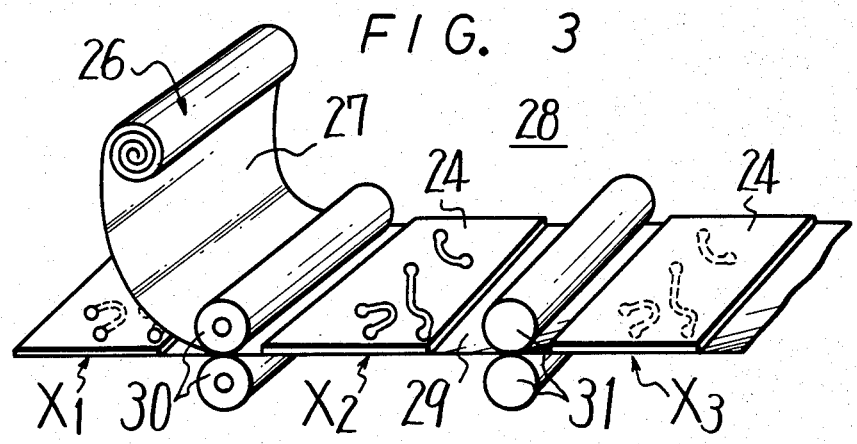
FIG. 3 is a perspective diagram showing an example of a roll laminating apparatus used when a multilayer circuit board of the present invention is obtained.

FIGS. 3 and 4 each show an example where the multilayer circuit board of the present invention is manufactured by a roll laminating method. According to the present invention, as shown in FIG. 4A, a copper laminated board where an insulating substrate (1.6 mm to 0.8 mm thick) 21 made of, for example, paper impregnated with phenolic resin, paper impregnated with epoxy resin and the like is coated on its one surface with a copper foil 22 of $15\mu$ to $35\mu$ thick is prepared, and then the copper foil 22 is subjected to the selective etching to form a first wiring pattern 23 whereby a so-called rigid circuit board 24 is provided. On this wiring substrate 24, there is formed by printing, as shown in FIG. 4B, an insulating resin layer 25 of 10 to $100\mu$, preferably 20 to $70\mu$ thick, made of ultraviolet hardening type resin which is cured by an ultraviolet radiation such as epoxy acrylate resin, spiroacetal resin, urethaneacrylate resin and the like other than a connection portion 23a of the first wiring pattern 23. When the insulating layer 25 of the ultraviolet hardening type resin contains no solvent, so that it is provided without pin holes and hence it can be formed as a thick layer. When the epoxy acrylate system resin is used as the insulating resin layer 25, in order to increase adherence thereof with a copper foil to be bonded thereafter, it is desired that the surface of its resinuous layer may be treated. For this surface treatment method, there are suggested a sand blast method by blowing fine powder such as iron powders of #325 mesh onto the whole surface, a brushing method by brushing the whole by a sandpaper, a surface roughening by corona discharge or plasma discharge, and further an etching method using methylene chloride, trichloroethylene, a cellosolve and the like as an etchant. For the insulating resin layer 25, other than the aforementioned ultraviolet hardening type resin, such paint as polybutadiene resin, epoxy resin epoxy-melamine resin and so on can be employed.

Figure 4A:
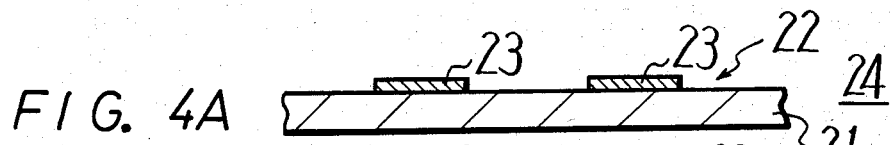
FIGS. 4A through 4G are cross-sectional diagrams showing the manufacturing processes of one example of the present invention in order.
Figure 4B:
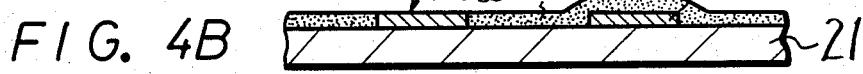
Figure 4C:
Figure 4D:

Next, as shown in FIGS. 4C and 4D, on the board 24 printed with the insulating resin layer 25 thereon is bonded with a copper foil 27 of about $15\mu$ to $35\mu$ thick with adhesive agent 26 attached to a back surface of the copper foil so as to be laminated and then integrated together. For the adhesive agent 26, a thermo-setting type resin such as epoxy acryl system resin, epoxy nitrile system resin or the like, thermo-softening type resin (softening temperature from 80° C. to 200° C.) such as polyamide resin, ethylene-vinyl acetate resin or the like or electron-beam curing type resin such as epoxy acrylate or the like can be employed. For the lamination of such copper foil 27, such a roll laminating apparatus 28 as shown in FIG. 3 is used to improve productivity thereof. This apparatus 28 includes, along the transport direction of its feeding belt 29 for feeding sequentially materials of the multilayer circuit board, a plurality of rolls, in other words, a pair of silicone rubber rolls 30 heated at, for example, 165° C. and a pair of metal rolls 31 which surface is plated with stainless steel or chromium and likewise heated at 165° C. In accordance with this apparatus 28, when the rigid circuit board 24 printed thereon with the insulating layer 25 is transported by the feeding belt 29 at a position $X_1$, the copper foil 27 with the adhesive agent 26 coated on one surface thereof is put on the board 24. Under this condition, they are passed through the gap between the silicon rubber rolls 30, and further passed through the gap between the metal rolls 31, whereby the copper foil 27 is laminated on the board 24 and then integrated together. The board 24 at a position $X_2$ in FIG. 3 corresponds to FIG. 4C, while the board 24 at a position $X_3$ corresponds to FIG. 4D. That is, they are bonded together such that the upper surface of the copper foil 27 is made flat, by a number of presses.

Figure 1A:
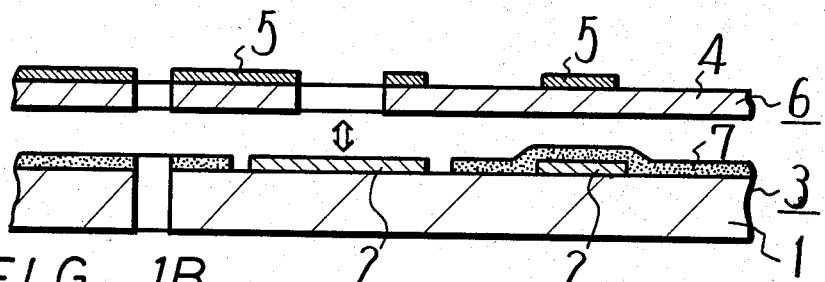
FIGS. 1A and 1B are cross-sectional diagrams showing an example of a prior art multilayer circuit board in the order of manufacturing processes.
Figure 1B:
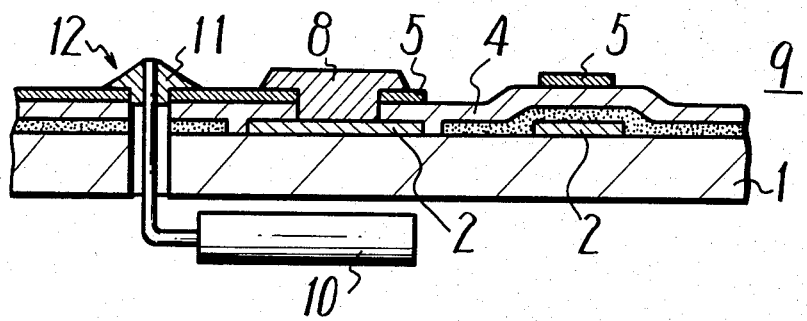
Figure 2:
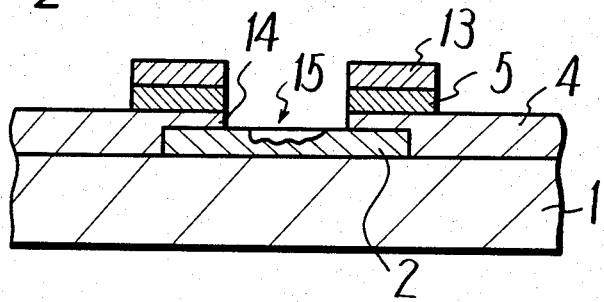
FIG. 2 is a cross-sectional diagram used to explain the prior art.
Figure 5:
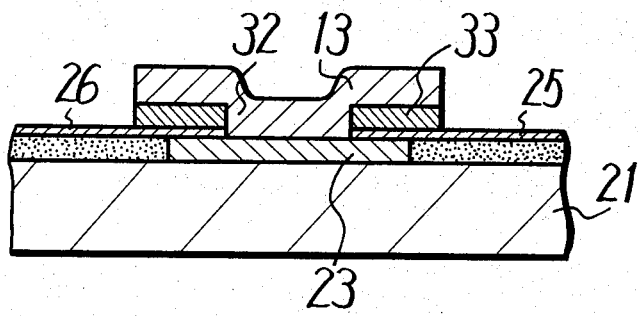
FIG. 5 is a cross-sectional diagram used to explain the present invention.
Figure 4E:
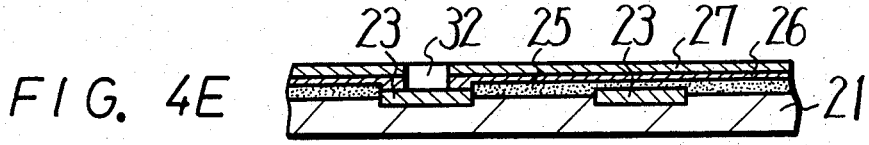
Figure 4F:
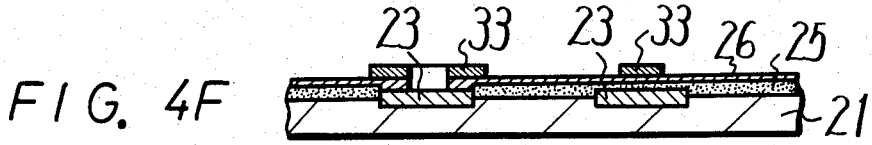

Next, as shown in FIG. 4E, the copper foil 27 is etched away selectively so as to remove its part corresponding to the connection portion 23a of the wiring pattern 23 of its under layer, and then the corresponding adhesive agent is removed to permit an opening portion 32 reaching the connection portion 23a to be formed. Next, as shown in FIG. 4F, the copper foil 27 is selectively etched away to permit a second wiring pattern 33 to be formed. In this patterning as shown in FIG. 5, a distance (step-like distance) between the first wiring pattern 23 and the copper foil 27 or the second wiring pattern 33 is so small that upon the printing of the resist ink 13, the resist ink 13 is also printed simultaneously within the opening portion 32. Thus the first wiring pattern 23 will never be etched by the etchant.

Figure 4G:
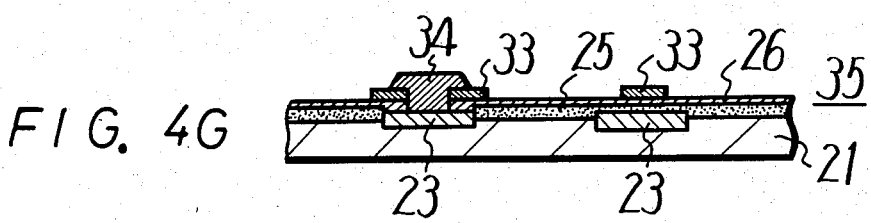
Figure 6A:
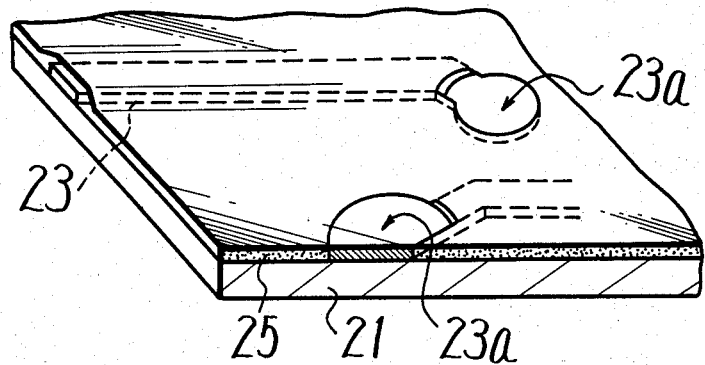
FIGS. 6A through 6E are perspective diagrams showing an example of a manufacturing method according to the present invention in the order of the processes.
Figure 6B:
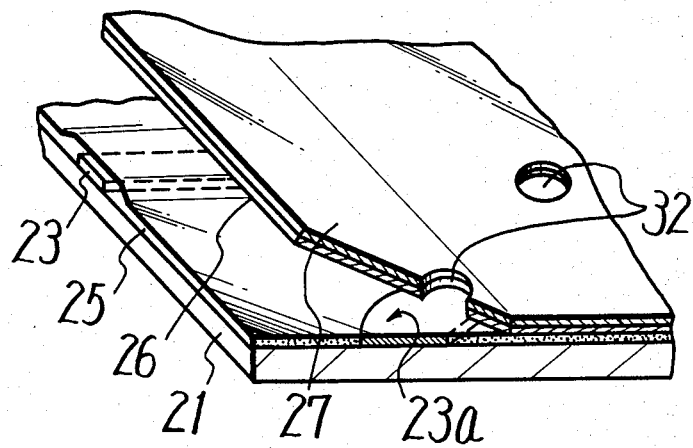
Figure 6C:
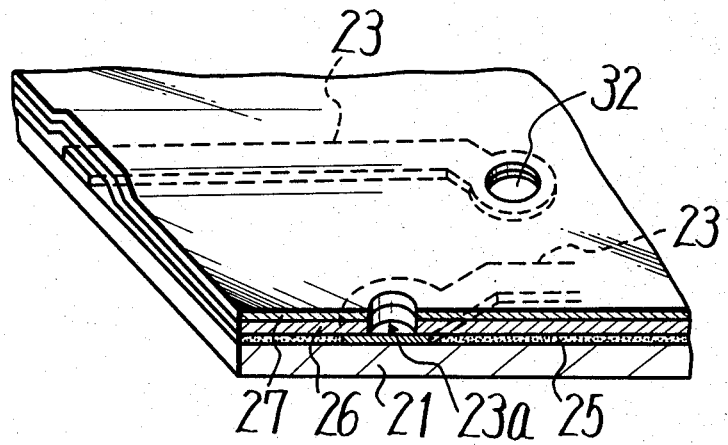
Figure 6D:
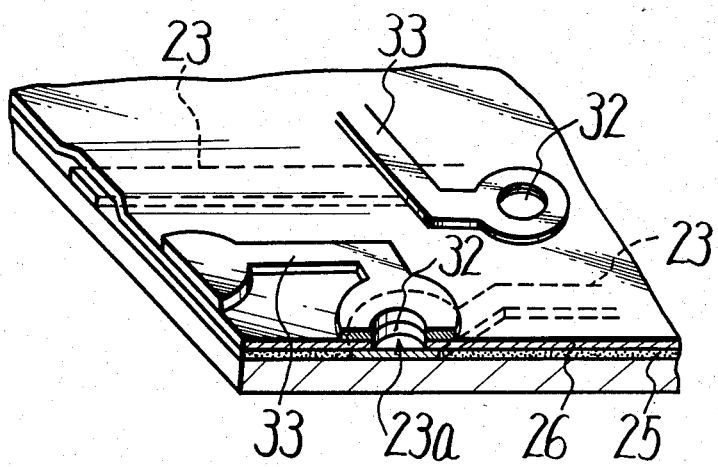
Figure 6E:
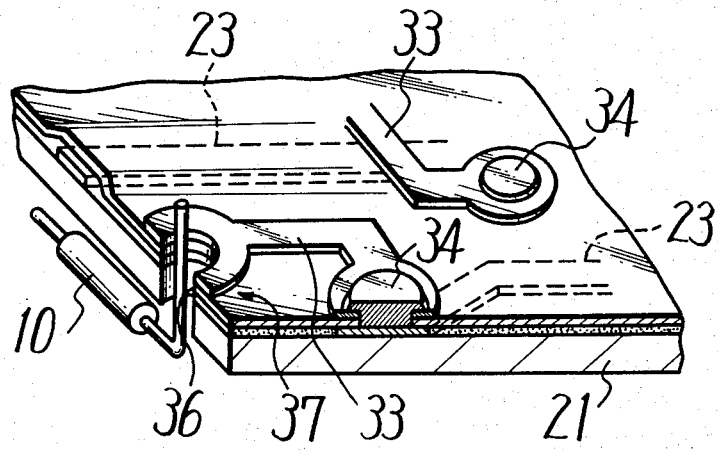
Figure 7A:
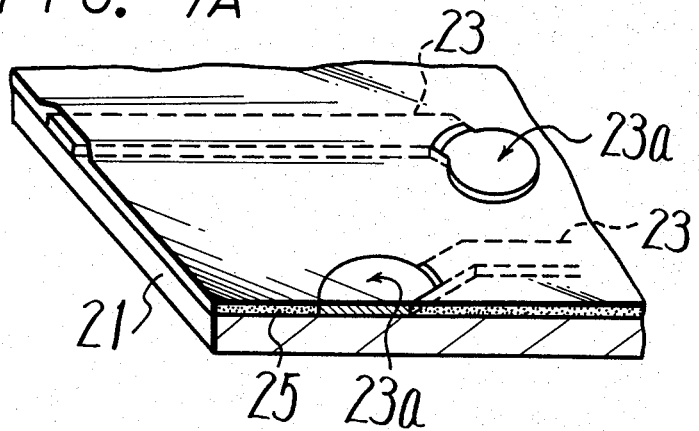
FIGS. 7A through 7E are perspective diagrams showing other example of a manufacturing method according to the present invention in the order of the processes.
Figure 7B:
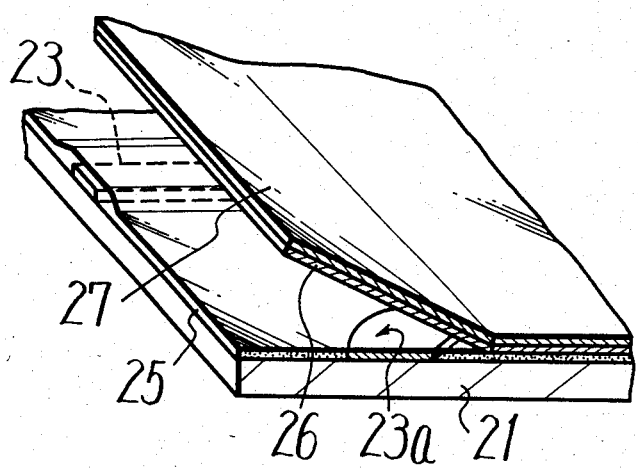
Figure 7C:
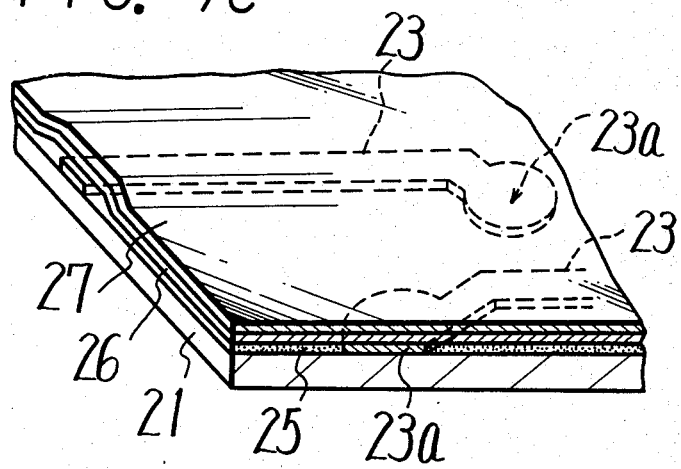
Figure 7D:
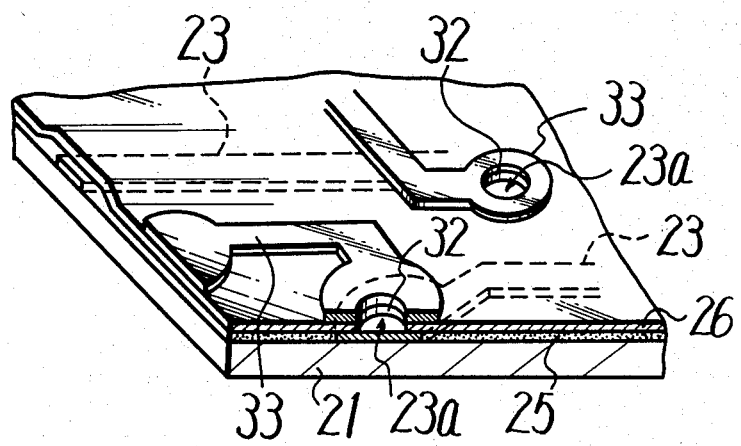
Figure 7E:
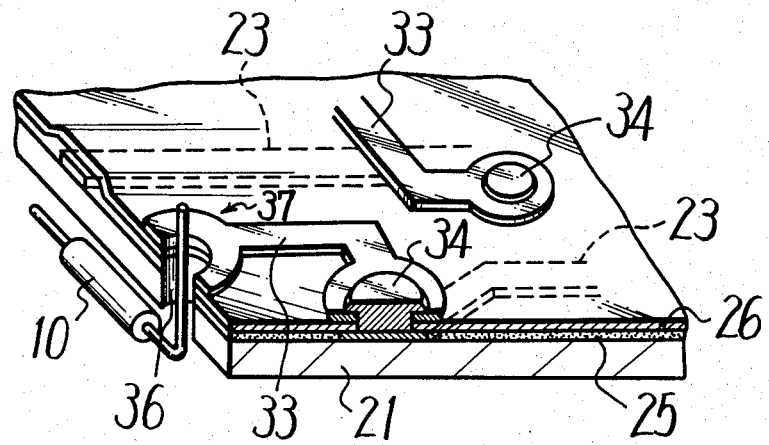

Thereafter, the resist ink 13 is removed off and the opening portion 32 is filled therein with conductive substance 34 so as to connect the upper and lower wiring patterns 23 and 33 with each other thus resulting in a desired multilayer circuit board as shown in FIG. 4G.

The conductive substance 34 in the opening 32 may be provided by filling a gallium alloy, a solder, a silver paste flame spraying (plazma flame spray or arc flame spray) metal having low melting temperature such as Cu, Zn or Sn, and forming a solder by solder-coater leveler treatment.

Particularly in the case of the gallium alloy, it is formed by a mixture of a melt of gallium Ga and a metal element eutectic with gallium at a temperature lower than so-called room temperature 30° C., and metal powder (metal powder of single metal or alloy powder) which alloys with the gallium and raises the melting point. The conductive substance made of this gallium alloy is presented as the paste-like appearance at the first working temperature, and thereafter alloyed and set in time lapse. For the metal to be eutectic with the gallium, a combination of metal of one or more than two kinds in indium In, tin Sn, zinc Zn and bismuth Bi, preferably, indium In, tin Sn and the like are available. For the metal powder alloyed with the gallium, single metal of such as nickel Ni, Cobalt Co, gold Au, copper Cu or alloy of them, for example, Ni-Cu alloy, further cobalt alloy, for example, Co-Sn alloy, copper alloy, for example, Cu-Sn alloy (Cu is more than 40 weight %), Cu-Zn alloy (Cu is more than 60 weight %), Cu-Be alloy (Cu is more than 98 weight %) and the like are available. For this metal powder, it is desired that the surface of the powder is difficult to be exydized, so Sn, Zn, Be and the like particularly in the copper alloy as described above are preferably in view of avoiding the oxidization of Cu. Particle sizes of these metal powders are in a range from $0.5\mu$ to $500\mu$, more desirably, $1.0\mu$ to $100\mu$. When the gallium alloy is employed, a problem of silver migration as in silver paint is avoided and the conductivity becomes the same as that by Cu plating so that the circuit arrangement with good quality and high density becomes possible.

There are suggested two methods for manufacturing the multilayer wiring substrate according to the above exemplified roll laminating method. One is such a method that the copper foil 27 is provided in advance with the connection opening portion 32, while the other is such a method that similarly to FIG. 4, after the copper foil 27 is laminated on the substrate 24, the opening portion 32 is provided therethrough. FIG. 6 shows the case of the former, and FIG. 7 shows the case of the latter.

Figure 8:
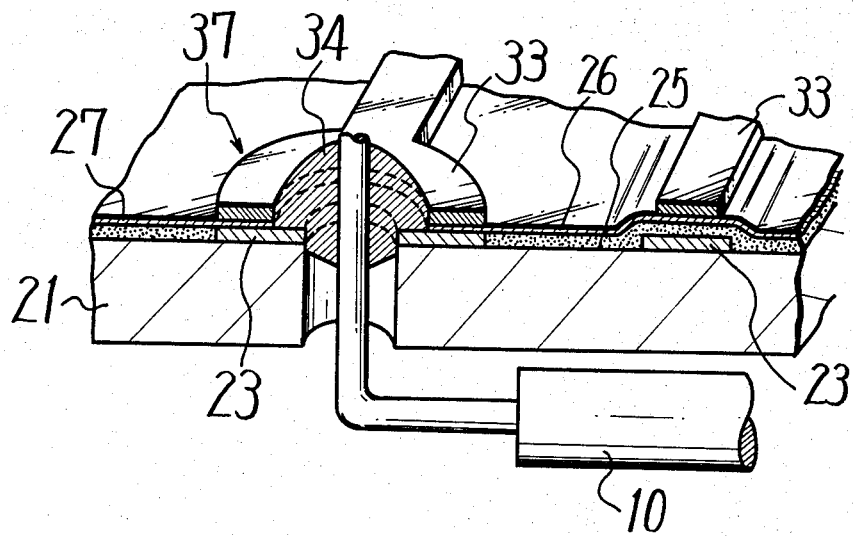
FIG. 8 is a perspective diagram showing an essential part of other example of the present invention.
Figure 9A:
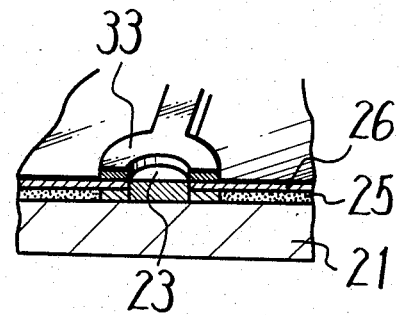
FIGS. 9A and 9B are perspective diagrams showing examples of connection portions of the present invention.
Figure 9B:
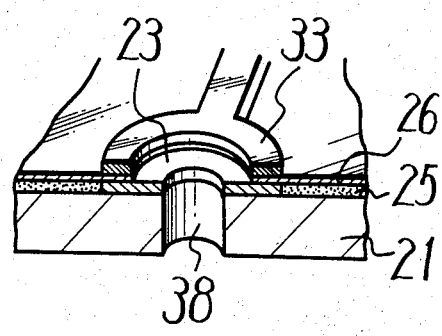

That is, throughout FIGS. 6A to 6E, the first wiring pattern 23 is formed and on the whole surface other than the connection portion 23a thereof printed is the insulating resin layer 25, thereafter the copper foil 27, through which the opening portion 32 was formed previously is laminated thereon, and then they are integrally laminated by the roll press. Next, the copper foil 27 undergoes the patterning so as to form the second wiring pattern 33, and then the opening portion 32 is filled with conductive substance, for example, the gallium alloy 34 to permit both of the patterns 23 and 33 to be connected together. Moreover, a through-hole 36 is provided, where the lead wire of the electric component 10 is connected. In FIGS. 7A to 7E, the first wiring pattern 23 is formed and on its whole surface other than the connection portion 23a the insulating resin layer 25 is formed by printing. Thereafter, the copper foil 27 is superimposed thereon, and then they are integrally laminated by the roll press. Next, the opening portion 32 and the second wiring pattern 33 are formed by the chemical etching means. It may also be possible that the opening portion 32 is bored therethrough at first, and similarly to the system of FIG. 6, the second wiring pattern 33 is patterned. Thereafter, if the adhesive agent layer exists on the opening portion, this adhesive is removed by organic solvent, and thereafter, the opening portion 32 is filled with, for example, the gallium alloy 34 and the through-hole 36 for the electric component 10 is formed. Here, as shown in FIG 8, at the same time when the lead wire of the electric parts 10 is soldered in a lead wire connection portion 37, the connection between both of the upper and lower patterns 23 and 33 can be carried out. Moreover, in the case where there is provided no mount for the electric component 10, if as illustrated in FIG. 9B, a through-hole 38 bored through the substrate 24 is provided at the connection portion, electrical connection by the conductive substance 34 iss improved much more. Therefore, the form of the connection portion between the upper and lower patterns 23 and 33 can be constructed as shown in FIG. 9A or FIG. 9B.

Figure 10:
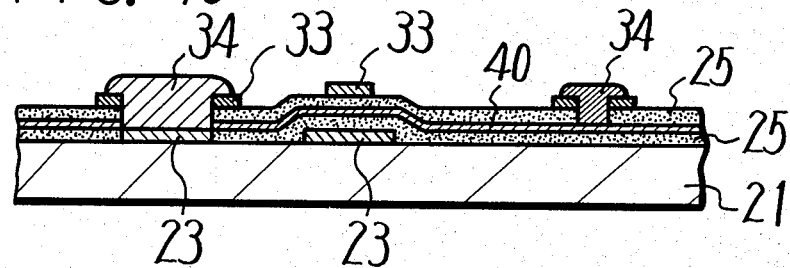
FIGS. 10 and 11 are cross-sectional diagrams, each showing further embodiment of the present invention.

FIG. 10 shows another embodiment of the present invention suitable for the circuit board handling high frequency signal. In this embodiment, on the insulating resin layer 25 formed is a metal layer (shield layer) 40 made of conductive layer formed by, for example, flame spraying metal coating a silver paste or a copper paste, vacuum deposited layers of Al, Ni, Cu and so forth; further formed by printing is the insulting resin layers 25 on the layer 40; and the second wiring pattern 33 made of the copper foil is further formed thereon. The patterns 23 and 33 are shield by this metal layer 40, which is made particularly suitable for use with a circuit board handling a high frequency signal.

Figure 11:
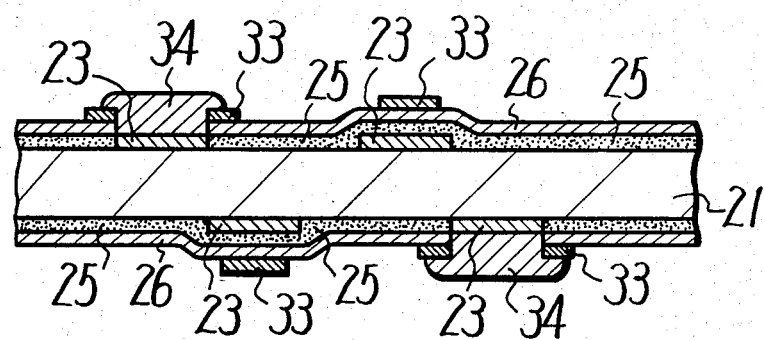
Figure 12:
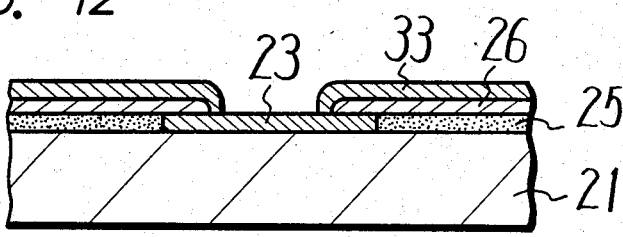
FIG. 12 is a cross-sectional diagram used to explain the present invention.

Moreover, according to the present invention, as for example, shown in FIG. 11, such a multilayer wiring structure can be formed in which the insulating resin layers 25 are similarly printed on the both surfaces of the so-called first wiring substrate 21 provided on its both surfaces with the wiring patterns 23 and the copper foils are bonded thereto so as to form the second wiring patterns 33.

Figure 13:
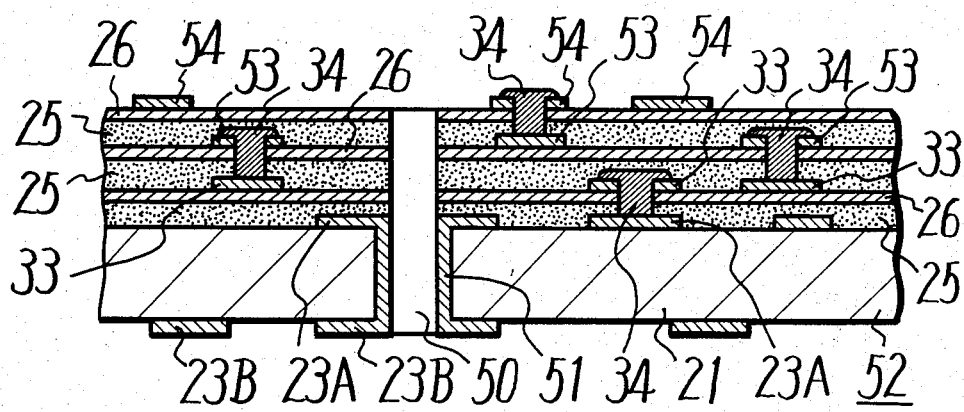
FIG. 13 is a cross-sectional diagram showing still further embodiment of the present invention.

Furthermore, according to the present invention, it may be possible that, as shown in FIG. 13, such a multilayer wiring structure can be presented in which multilayers are laminated on a board having through holes. That is, as shown in the figure, the insulating substrate 21 such as the paper impregnated with phenol resin, the paper impregnated with epoxy resin, the glass cloth impregnated with epoxy resin and the like (1.6 mm to 0.8 mm thick) is provided similar to the above example on its both surfaces with the first wiring patterns 23A and 23B, each made of copper foil of 15μ to 35μ thick. Then, both of the desired wiring patterns 23A and 23B are connected to each other by way of a conductive plated layer 51 formed within its through-hole 50 thus a both surface substrate 52 being provided, on which the insulating resin layer 25 made of paint such as polybutadiene resin, epoxy resin, epoxymelamine resin and the like excluding the connection portion is printed. The copper foil coated on its back surface with the adhesive agent 26 is bonded thereon, and the patterning is carried out therefor to form the second wiring patterns 33. The conductive substance 34 is filled within the opening portion to thereby connect the upper and lower wiring patterns 23A and 33 to each other. Further, the above processes are repeated to form third and fourth wiring patterns 53 and 54 thus resulting in the multilayer structure. In accordance with the multilayer wiring substrate thus composed, since it is the multilayer substrate made of thin laminated layers, no complication appears in laminating process and hence such multilayer circuit board of high reliability, high density and at low cost can be provided without phenomena such as smearing and the like. When the gallium alloy is used as the conductive material, such defects as a silver electromigration phenomenon, a poor high frequency characteristic, an excessively large electric resistance value can be overcome. In the construction thus made so far, the multilayer wiring board can be used in such a manner that the rigid circuit board having wiring patterns on both side thereof is used for high frequency circuit and laminated wiring pattern 26 can be used for signal line. As regards the rigid circuit board, the electrical connection of wiring patterns of both sides of the substrate can be achieved through through-holes connected by a plated metal layer connecting pin silver paint, gallium alloy and so on.

In the above, if such one that has adhesive property is utilized as the insulating resin layer 25, the adhesive agent coated at the back surface of the copper foil 27 can be omitted.

We claim:

1. The method of fabricating a multilayer circuit board comprising the steps of:

forming a first wiring pattern having a predetermined location for a connection portion on an insulating substrate, forming an insulating resin layer on said first wiring pattern, laminating a conductive foil with an adhesive layer to said insulating resin layer and the first wiring pattern, including said predetermined location, providing a void in said conductive foil at said predetermined location, etching said conductive foil to form a second wiring pattern, removing the adhesive layer at said predetermined location to form a passage between said first wiring pattern and said second wiring pattern, and filling the passage with a conductive substance to establish electrical continuity between said first and second wiring patterns.

2. A method according to claim 1 wherein the thickness of said insulating resin layer is in the range from 10 to 100 microns.

3. A method according to claim 1 wherein the thickness of said insulating resin layer is in the range from 20 to 70 microns.

4. A method according to claim 1 wherein said insulating resin is composed of an ultraviolet hardening type resin.

5. A method according to claim 1 wherein said void is provided by etching at said predetermined location.

6. A method according to claim 1 wherein said void is provided by means of using a conductive foil with an opening overlying said predetermined location.

7. A method according to claim 1 in which said laminating is carried out by applying pressure from laminating rolls.

8. A method according to claim 7 wherein said laminating is carried out by successively applying pressure from heated elastomer covered rolls and then by metal rolls.

* * * * *